(12) United States Patent
Chen et al.

(10) Patent No.: US 10,242,972 B2
(45) Date of Patent: Mar. 26, 2019

(54) PACKAGE STRUCTURE AND FABRICATION METHOD THEREOF

(71) Applicant: Siliconware Precision Industries Co., Ltd., Taichung (TW)

(72) Inventors: Lu-Yi Chen, Taichung (TW);
Chang-Lun Lu, Taichung (TW);
Shih-Ching Chen, Taichung (TW);
Guang-Hwa Ma, Taichung (TW);
Cheng-Hsu Hsiao, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 14/986,149

(22) Filed: Dec. 31, 2015

(65) Prior Publication Data
US 2016/0233194 A1  Aug. 11, 2016

(30) Foreign Application Priority Data

Feb. 6, 2015 (TW) .............................. 104104027 A

(51) Int. Cl.
*H01L 23/58* (2006.01)
*H01L 21/78* (2006.01)
(Continued)

(52) U.S. Cl.
CPC ........ *H01L 25/105* (2013.01); *H01L 21/6835* (2013.01); *H01L 23/3128* (2013.01);
(Continued)

(58) Field of Classification Search
CPC ... H01L 25/117; H01L 23/4012; H01L 25/00; H01L 23/53295; H01L 25/043;
(Continued)

(56) References Cited

U.S. PATENT DOCUMENTS 5,487,218 A * 1/1996 Bhatt .................. H01L 23/5384
174/262
5,689,091 A * 11/1997 Hamzehdoost ..... H01L 23/3121
174/255

(Continued)

*Primary Examiner* — Mary Wilczewski
*Assistant Examiner* — Tsz Chiu
(74) *Attorney, Agent, or Firm* — Mintz Levin Cohn Ferris Glovsky and Popeo, P.C.; Peter F. Corless; Steven M. Jensen

(57) ABSTRACT

A package structure is provided, which includes: a dielectric layer having opposite first and second surfaces; a circuit sub-layer formed in the dielectric layer; an electronic element disposed on the first surface of the dielectric layer and electrically connected to the circuit sub-layer; a plurality of conductive posts formed on the first surface of the dielectric layer and electrically connected to the circuit sub-layer; and an encapsulant formed on the first surface of the dielectric layer and encapsulating the electronic element and the conductive posts. Upper surfaces of the conductive posts are exposed from the encapsulant so as to allow another electronic element to be disposed on the conductive posts and electrically connected to the circuit sub-layer through the conductive posts, thereby overcoming the conventional drawback that another electronic element can only be disposed on a lower side of a package structure and improving the functionality of the package structure.

27 Claims, 8 Drawing Sheets

(51) Int. Cl.
  *H01L 25/10* (2006.01)
  *H01L 21/683* (2006.01)
  *H01L 23/538* (2006.01)
  *H01L 23/31* (2006.01)
  *H01L 25/03* (2006.01)

(52) U.S. Cl.
  CPC ...... *H01L 23/5384* (2013.01); *H01L 23/5385* (2013.01); *H01L 23/5386* (2013.01); *H01L 25/03* (2013.01); *H01L 2221/68345* (2013.01); *H01L 2224/16227* (2013.01); *H01L 2224/16235* (2013.01); *H01L 2224/32225* (2013.01); *H01L 2224/73204* (2013.01); *H01L 2224/73253* (2013.01); *H01L 2224/81005* (2013.01); *H01L 2224/83005* (2013.01); *H01L 2225/1035* (2013.01); *H01L 2225/1058* (2013.01); *H01L 2924/1533* (2013.01); *H01L 2924/15311* (2013.01); *H01L 2924/18161* (2013.01); *H01L 2924/19103* (2013.01)

(58) Field of Classification Search
  CPC .............. H01L 25/0657; H01L 25/074; H01L 25/0756; H01L 27/3209; H01L 2201/10515; H01L 2225/06513; H01L 2225/06517; H01L 23/488; H01L 24/01; H01L 2224/0401; H01L 23/5384–23/5386
  USPC ........................................................ 257/783
  See application file for complete search history.

(56) References Cited

U.S. PATENT DOCUMENTS

| | | | | |
|---|---|---|---|---|
| 5,767,575 A | * | 6/1998 | Lan | H01L 23/13 257/701 |
| 5,822,856 A | * | 10/1998 | Bhatt | H05K 1/113 174/262 |
| 6,268,016 B1 | * | 7/2001 | Bhatt | C23C 18/1632 118/400 |
| 6,569,604 B1 | * | 5/2003 | Bhatt | H01L 23/49816 257/E23.067 |
| 2004/0125574 A1 | * | 7/2004 | Yoon | H01L 25/105 361/735 |
| 2006/0055017 A1 | * | 3/2006 | Cho | H01L 25/105 257/686 |
| 2008/0029884 A1 | * | 2/2008 | Grafe | H01L 23/5385 257/723 |
| 2009/0008793 A1 | * | 1/2009 | Pohl | H01L 21/568 257/777 |
| 2009/0284947 A1 | * | 11/2009 | Beddingfield | H01L 23/49833 361/818 |
| 2010/0072588 A1 | * | 3/2010 | Yang | H01L 23/49816 257/676 |
| 2010/0301474 A1 | * | 12/2010 | Yang | H01L 21/6835 257/737 |
| 2012/0018870 A1 | * | 1/2012 | Chang | H01L 21/561 257/692 |
| 2013/0075936 A1 | * | 3/2013 | Lin | H01L 24/19 257/777 |
| 2013/0093078 A1 | * | 4/2013 | Lin | H01L 21/568 257/737 |
| 2014/0035156 A1 | * | 2/2014 | Hsu | H01L 23/49816 257/774 |
| 2014/0054760 A1 | * | 2/2014 | Yu | H01L 23/34 257/692 |
| 2014/0145323 A1 | * | 5/2014 | Lee | H01L 23/3128 257/692 |
| 2014/0147972 A1 | * | 5/2014 | Semmelmeyer | H01L 25/0652 438/109 |

* cited by examiner

PACKAGE STRUCTURE AND FABRICATION METHOD THEREOF

CROSS-REFERENCES TO RELATED APPLICATIONS

This application claims under 35 U.S.C. § 119(a) the benefit of Taiwanese Application No. 104104027, filed Feb. 6, 2015, the entire contents of which are incorporated herein by reference.

BACKGROUND OF THE INVENTION

1. Field of the Invention

The present invention relates to package structures and fabrication methods thereof, and more particularly, to a stack-type package structure and a fabrication method thereof.

2. Description of Related Art

Along with the rapid development of electronic industries, electronic products are developed toward the trend of multi-function and high performance. Current chip packaging technologies have developed various types of flip-chip packaging modules such as chip scale packages (CSPs), direct chip attached (DCA) packages and multi-chip module (MCM) packages.

In a flip-chip packaging process, a big CTE (Coefficient of Thermal Expansion) mismatch between a chip and a substrate adversely affects the formation of joints between conductive bumps of the chip and corresponding contacts of the substrate and easily causes delamination of the conductive bumps from the substrate. Further, along with increased integration of integrated circuits, the CTE mismatch between the chip and the substrate induces more thermal stresses and leads to more serious warpage, thereby reducing the reliability of electrical connection between the chip and the substrate and resulting in failure of a reliability test.

Accordingly, an interposer made of a semiconductor material is provided between the substrate and the chip to form a semiconductor stack structure. Since the interposer is close in material to the chip, the above-described drawbacks caused by a CIE, mismatch can be effectively overcome.

FIG. 1 is a schematic cross-sectional view of a conventional semiconductor stack structure 1. Referring to FIG. 1, a silicon interposer 10 is disposed between a packaging substrate 18 and a semiconductor chip 11. The silicon interposer 10 has a plurality of through silicon vias (TSVs) 100 and an RDL (redistribution layer) structure 15 formed on the TSVs 100. The RDL structure 15 of the silicon interposer 10 is electrically connected to bonding pads 180 of the packaging substrate 18 through a plurality of conductive elements 17. The bonding pads 180 of the packaging substrate 18 have a large pitch therebetween. Further, an adhesive material 12 is formed to encapsulate the conductive elements 17. The TSVs 100 of the silicon interposer 10 is electrically connected to electrode pads 110 of the semiconductor chip 11 through a plurality of solder bumps 19. The electrode pads 110 of the semiconductor chip 11 have a small pitch therebetween. Further, an adhesive material 12 is formed to encapsulate the solder bumps 19.

The 3D semiconductor stack structure 1 having the silicon interposer 10 overcomes the above-described drawbacks caused by a CIE, mismatch and has a reduced size. For example, a substrate generally has a minimum line width/pitch of 12/12 um. When the I/O count of a semiconductor chip increases, since the line width/pitch of the substrate cannot be reduced, the area of the substrate must be increased such that more traces can be formed on the substrate and electrically connected to the semiconductor chip. On the other hand, referring to FIG. 1, the semiconductor chip 11 is disposed on the silicon interposer 10 having TSVs 100 and electrically connected to the substrate 18 through the silicon interposer 10. Since the silicon interposer 10 has a line width/pitch of 3/3 um or less, the area of the silicon interposer 11 is sufficient for electrical connection with the semiconductor chip 11 having a high I/O count and hence the area of the substrate 18 does not need to be increased. Further, the fine line width/pitch of the silicon interposer 10 facilitates to shorten the electrical transmission path. Therefore, the semiconductor chip 11 disposed on the silicon interposer 10 achieves a higher electrical transmission speed than if being directly disposed on the substrate 18.

However, the 3D semiconductor stack structure 1 having the silicon interposer 10 has a high fabrication cost. Accordingly, Silicon-less interconnect technology has been developed to fabricate packages that do not include silicon interposers and have a size less than the 3D semiconductor stack structure. FIGS. 2A to 2C are schematic cross-sectional views showing a method for fabricating such a package structure.

Referring to FIG. 2A, a first dielectric layer 21 is formed on a carrier 20 and has a plurality of openings exposing portions of the carrier 20. Then, a circuit sub-layer 22 is formed on the first dielectric layer 21. Thereafter, a second dielectric layer 23 is formed on the first dielectric layer 21 and the circuit sub-layer 22 and has a plurality of openings exposing portions of the circuit sub-layer 22. Subsequently, a plurality of conductive bumps 24 are formed in the openings of the second dielectric layer 23 and electrically connected to the circuit sub-layer 22.

Referring to FIG. 2B, a semiconductor chip 25 is disposed on the conductive bumps 24, and an underfill 26 is formed between the semiconductor chip 25 and the second dielectric layer 23. Then, an encapsulant 27 is formed on the second dielectric layer 23 for encapsulating the semiconductor chip 25 and the underfill 26.

Referring to FIG. 2C, the carrier 20 is removed to expose portions of the circuit sub-layer 22. Then, a plurality of conductive elements 28 are formed on the exposed portions of the circuit sub-layer 22. As such, a small-sized package structure without a silicon interposer is obtained. The package structure can further be electrically connected to an external electronic element through the conductive elements 28.

However, since an external electronic element such as a circuit board, a packaging substrate or a printed circuit board can only be disposed on a lower side of the package structure (i.e., the side having the conductive elements 28), the functionality of the package structure is extremely limited and the end application of the package structure is greatly reduced. As such, the package structure cannot meet the requirement of current end products.

Therefore, there is a need to provide a package structure and a fabrication method thereof so as to overcome the above-described drawbacks.

SUMMARY OF THE INVENTION

In view of the above-described drawbacks, the present invention provides a method for fabricating a package structure, which comprises the steps of: providing a dielectric layer having a circuit sub-layer, wherein the dielectric layer has a first surface and a second surface opposite to the first surface; disposing an electronic element on the first surface of the dielectric layer, wherein the electronic element is electrically connected to the circuit sub-layer; forming a plurality of conductive posts on the first surface of the dielectric layer, wherein the conductive posts are electrically connected to the circuit sub-layer; and forming an encapsulant on the first surface of the dielectric layer to encapsulate the electronic element and the conductive posts, wherein upper surfaces of the conductive posts are exposed from the encapsulant.

In an embodiment, forming the dielectric layer having the circuit sub-layer comprises: forming a first dielectric layer on a surface of a carrier, wherein the first dielectric layer has a plurality of first openings exposing portions of the surface of the carrier; forming a first metal layer on the first dielectric layer and in the first openings of the first dielectric layer; forming a first resist layer on the first metal layer, wherein the first resist layer has a plurality of open areas exposing portions of the first metal layer on the first dielectric layer and in the first openings; forming a circuit sub-layer on the first metal layer in the open areas of the first resist layer; and removing the first resist layer and the first metal layer under the first resist layer.

In an embodiment, the circuit sub-layer has a plurality of conductive bumps formed thereon. Forming the conductive bumps comprises: forming a second dielectric layer on the first dielectric layer and the circuit sub-layer, wherein the second dielectric layer has a plurality of second openings exposing portions of the circuit sub-layer; forming a second metal layer on the second dielectric layer and in the second openings of the second dielectric layer; forming a second resist layer on the second metal layer, wherein the second resist layer has a plurality of open areas exposing portions of the second metal layer in the second openings and around peripheries of the second openings; forming conductive bumps on the second metal layer in the open areas of the second resist layer, wherein the conductive bumps are electrically connected to the circuit sub-layer; and removing the second resist layer.

In an embodiment, the circuit sub-layer has a plurality of conductive posts formed thereon. Forming the conductive posts comprises: forming a third resist layer on the second metal layer and the conductive bumps, wherein the third resist layer has a plurality of open areas exposing portions of the second metal layer; and forming conductive posts on the second metal layer in the open areas of the third resist layer, wherein the conductive posts are electrically connected to the circuit sub-layer.

In an embodiment, the circuit sub-layer has a plurality of conductive elements formed thereon. Forming the conductive elements comprises: removing the carrier so as to expose portions of the first metal layer from the first dielectric layer; and forming conductive elements on the exposed portions of the first metal layer. The method can further comprise disposing an external device such as a circuit board on the conductive elements and disposing another electronic element on the conductive posts.

In an embodiment, the method further comprises forming an RDL (Redistribution Layer) structure on the encapsulant, wherein the RDL structure is electrically connected to the conductive posts. The method can further comprise disposing another electronic element on the RDL structure.

The present invention further provides a package structure, which comprises: a dielectric layer having a first surface and a second surface opposite to the first surface; a circuit sub-layer formed in the dielectric layer; an electronic element disposed on the first surface of the dielectric layer and electrically connected to the circuit sub-layer; a plurality of conductive posts formed on the first surface of the dielectric layer and electrically connected to the circuit sub-layer; and an encapsulant formed on the first surface of the dielectric layer and encapsulating the electronic element and the conductive posts, wherein upper surfaces of the conductive posts are exposed from the encapsulant.

In an embodiment, the package structure further comprises an RDL structure formed on the encapsulant and electrically connected to the conductive posts. The package structure can further comprise another electronic element disposed on the RDL structure.

In an embodiment, the package structure further comprises a plurality of conductive elements formed on the second surface of the dielectric layer and electrically connected to the circuit sub-layer.

According to the present invention, a plurality of conductive posts are formed on the dielectric layer and electrically connected to the circuit sub-layer, and the conductive posts are exposed from the encapsulant. Further, an RDL structure can be formed on the encapsulant and electrically connected to the conductive posts. As such, another electronic element such as a chip or another package structure can be disposed on an upper side of the package structure. Compared with the conventional package structure that only allows another electronic element such as a circuit board, a packaging substrate or a printed circuit board to be disposed on a lower side thereof, the package structure of the present invention has improved functionality and meets the multi-function requirement of current end products.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "first", "second", "on", "a" etc. are merely for illustrative purposes and should not be construed to limit the scope of the present invention.

Figure 1:
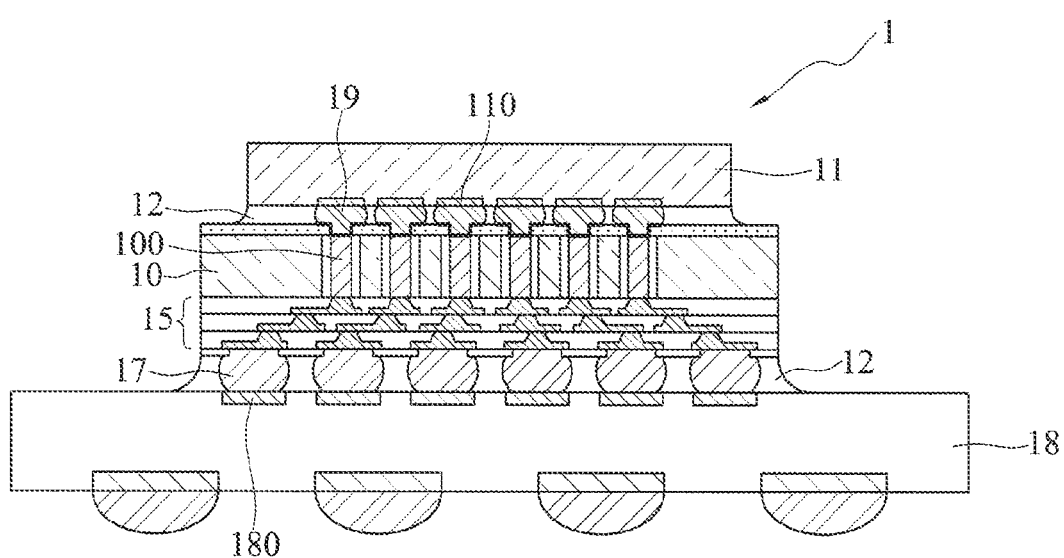
FIG. 1 is a schematic cross-sectional view of a conventional semiconductor stack structure.
Figure 2A:
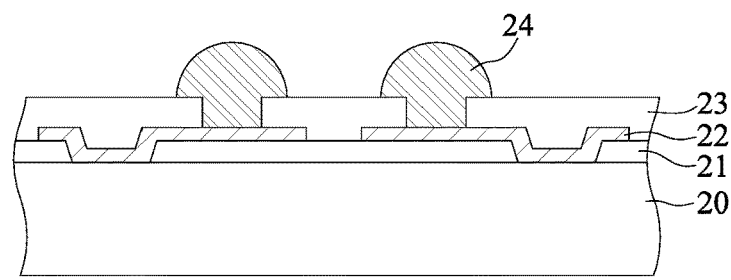
FIGS. 2A and 2C are schematic cross-sectional views showing a method for fabricating a package structure according to the prior art.
Figure 2B:
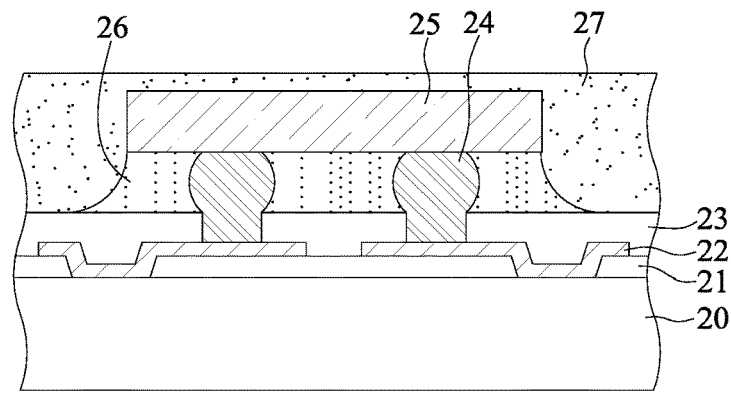
Figure 2C:
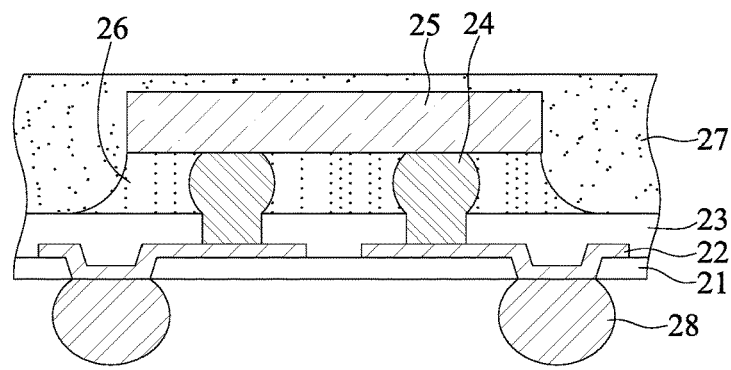
Figure 3A:
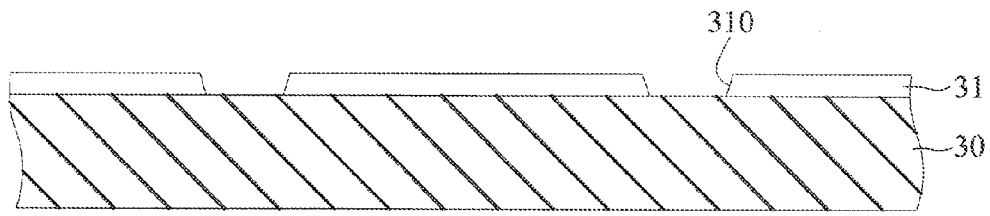
FIGS. 3A to 3M are schematic cross-sectional views showing a method for fabricating a package structure according to a first embodiment of the present invention.

FIGS. 3A to 3M are schematic cross-sectional views showing a method for fabricating a package structure according to a first embodiment of the present invention. Referring to FIG. 3A, a first dielectric layer 31 is formed on a surface of a carrier 30 by such as coating. By performing a patterning process, a plurality of first openings 310 are formed in the first dielectric layer 31 to expose portions of the surface of the carrier 30.

In the present embodiment, the first dielectric layer 31 is made of polyimide (PI), benzocyclobutene (BCB) or polybenzoxazole (PBO). The carrier 30 is a silicon wafer, a glass board, a board having an aluminum layer on a surface thereof, or an aluminum board. Preferably, the carrier 30 is a silicon wafer having a sputtered aluminum layer on a surface thereof.

Figure 3B:
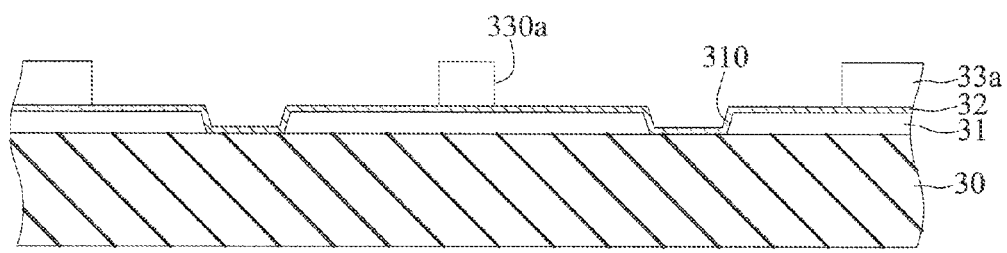

Referring to FIG. 3B, a first metal layer 32 is formed on the first dielectric layer 31 and in the first openings 310 of the first dielectric layer 31 by sputtering.

Then, a first resist layer 33a such as photoresist is formed on the first metal layer 32 by coating, and a patterning process is performed by exposure and development to form a plurality of open areas 330a in the first resist layer 33a. As such, portions of the first metal layer 32 on the first dielectric layer 31 and in the first openings 310 are exposed from the open areas 330a of the first resist layer 33a.

In the present embodiment, the first metal layer 32 serves as a seed layer for electroplating. The first metal layer 32 is made of, but not limited to, Ti, Cu, Ni, V, Al, W, Au or a combination thereof.

Figure 3C:
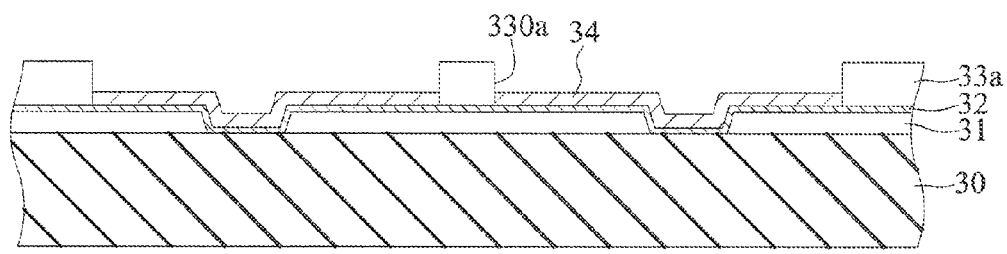

Referring to FIG. 3C, by using the first metal layer 32 as a current conductive path, an electroplating process is performed to form a circuit sub-layer 34 on the first metal layer 32 in the open areas 330a.

In the present embodiment, the circuit sub-layer 34 is made of, but not limited to, copper or aluminum.

Figure 3D:
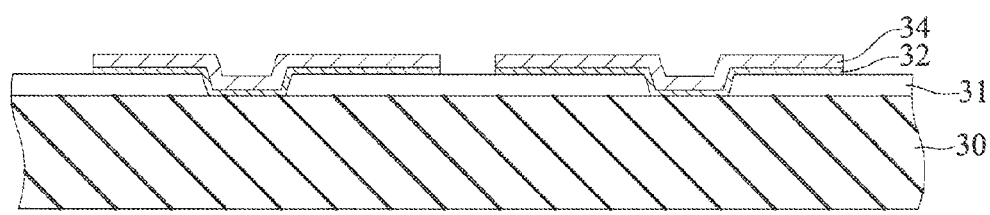

Referring to FIG. 3D, the first resist layer 33a is removed by such as stripping, and the first metal layer 32 under the first resist layer 33a is removed by such as etching.

Figure 3E:
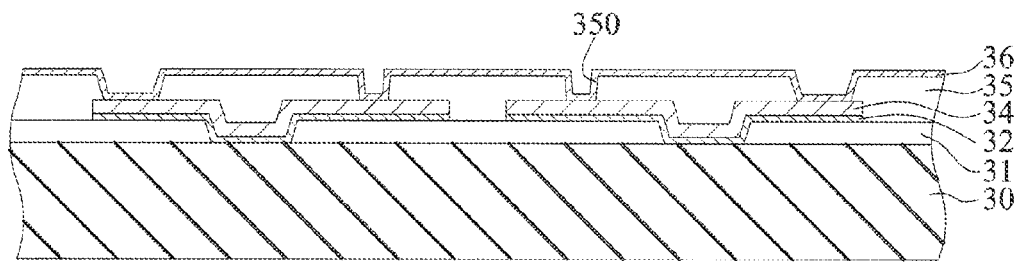

Referring to FIG. 3E, a second dielectric layer 35 is formed on the first dielectric layer 31 and the circuit sub-layer 34 by such as coating, and a patterning process is performed by exposure and development so as to form a plurality of second openings 350 in the second dielectric layer 35. As such, portions of the circuit sub-layer 34 are exposed from the second openings 350 of the second dielectric layer 35.

Then, a second metal layer 36 is formed on the second dielectric layer 35 and in the second openings 350 of the second dielectric layer 35 by sputtering.

In the present embodiment, the second dielectric layer 35 is made of polyimide (PI), benzocyclobutene (BCB) or polybenzoxazole (PBO), and the second metal layer 36 is made of, but not limited to, Ti, Cu, Ni, V, Al, W, Au or a combination thereof.

Figure 3F:
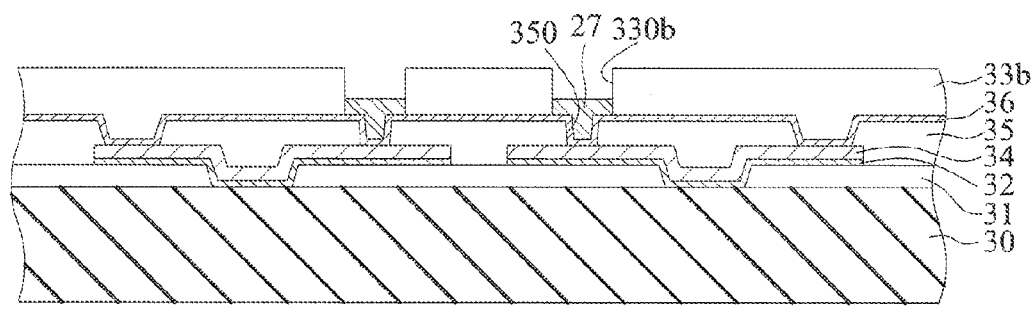

Referring to FIG. 3F, a second resist layer 33b such as photoresist is formed on the second metal layer 36 by coating, and a patterning process is performed by exposure and development so as to form a plurality of open areas 330b in the second resist layer 33b. As such, portions of the second metal layer 36 in the second openings 350 and around peripheries of the second openings 350 are exposed from the open areas 330b of the second resist layer 33b.

Then, by using the second metal layer 36 as a current conductive path, an electroplating process is performed to form a plurality of conductive bumps 37 on the second metal layer 36 in the open areas 330b. As such, the conductive bumps 37 are electrically connected to the circuit sub-layer 34.

In the present embodiment, the conductive bumps 37 include a solder material, for example, Sn—Ag lead-free solder. Also, the solder material can include Cu, Ni or Ge. Further, the second metal layer 36 serves as a UBM (Under Bump Metallurgy) layer.

Figure 3G:
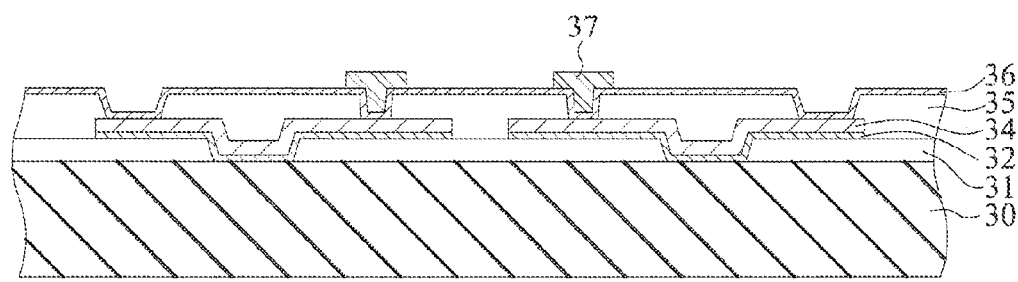

Referring to FIG. 3G, the second resist layer 33b is removed by such as stripping to expose the second metal layer 36. It should be noted that the process does not remove the second metal layer 36 under the second resist layer 33b.

Figure 3H:
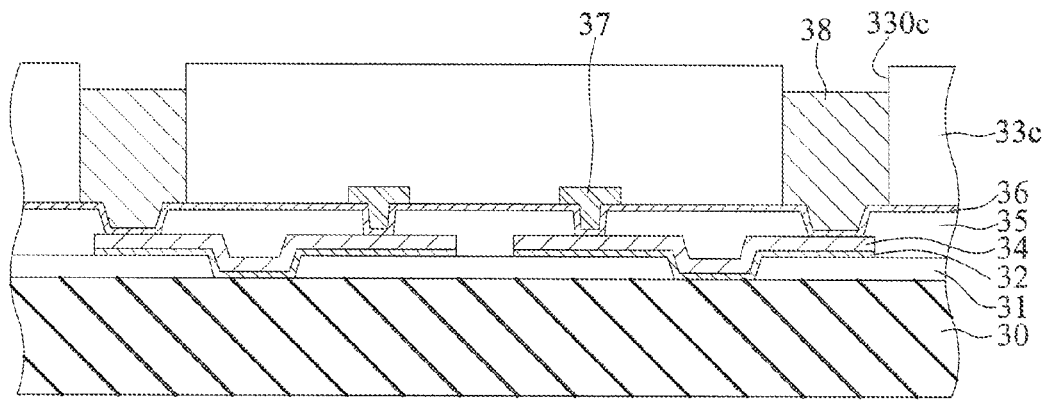

Referring to FIG. 3H, a third resist layer 33c such as photoresist is formed on the second metal layer 36 and the conductive bumps 37 by coating, and a patterning process is performed by exposure and development to form a plurality of open areas 330c in the third resist layer 33c. As such, portions of the second metal layer 36 are exposed from the open areas 330c of the third resist layer 33c.

Then, by using the second metal layer 36 as a current conductive path, an electroplating process is performed to form a plurality of conductive posts 38 on the second metal layer 36 in the open areas 330c. As such, the conductive posts 38 are electrically connected to the circuit sub-layer 34. Further, the conductive posts 38 are positioned at an outer periphery of the conductive bumps 37.

Figure 3I:
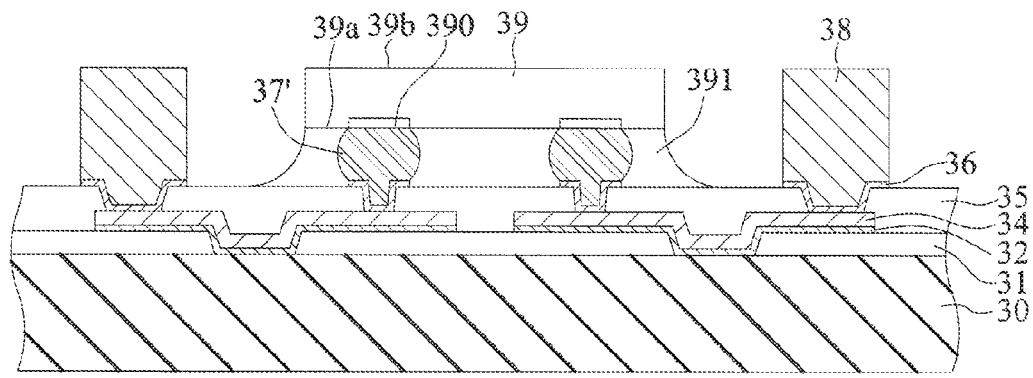

Referring to FIG. 3I, the third resist layer 33c is removed by stripping, and the second metal layer 36 under the third resist layer 33c is removed by such as etching to expose the conductive bumps 37.

Then, an electronic element 39 is disposed on the conductive bumps 37. The electronic element 39 has an active surface 39a and an inactive surface 39b opposite to the active surface 39a.

In the present embodiment, the active surface 39a of the electronic element 39 has a plurality of electrode pads 390, and a solder material is selectively formed on the electrode pads 390. As such, by performing a reflow process, the electronic pads 390 are bonded to the conductive bumps 37 to form a plurality of bumps 37', thus firmly attaching the electronic element 39 to the second dielectric layer 35. Further, an underfill 391 can be selectively formed between the electronic element 39 and the second dielectric layer 35 to encapsulate the bumps 37'. The electronic element 39 can be an active element such as a semiconductor chip, or a passive element.

Figure 3J:
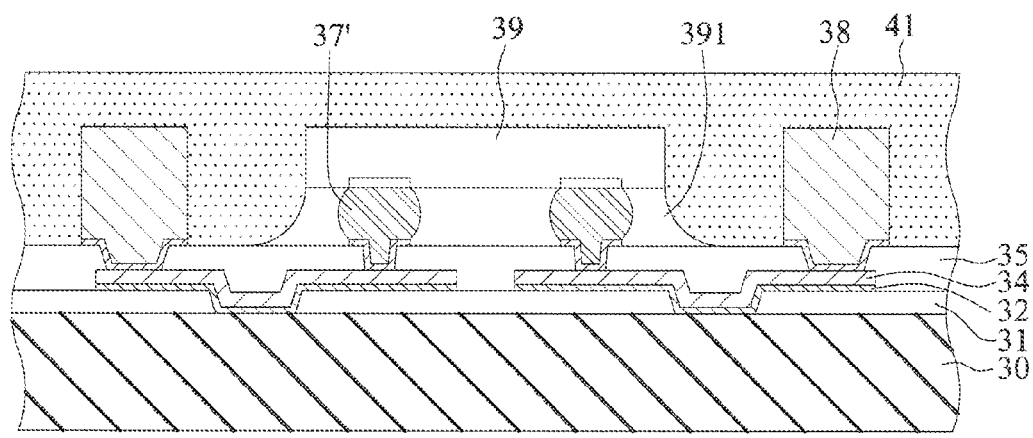

Referring to FIG. 3J, an encapsulant 41 is formed on the second dielectric layer 35 to encapsulate the conductive posts 38 and the electronic element 39.

Figure 3K:
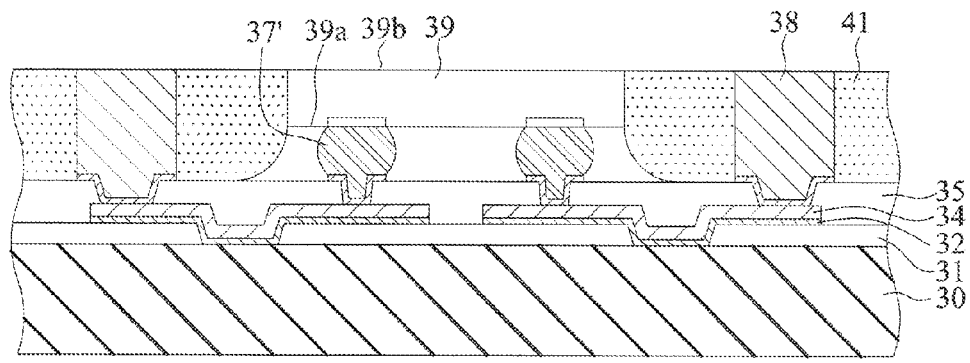

Referring to FIG. 3K, the encapsulant 41 is thinned by such as grinding to expose upper surfaces of the conductive posts 38. Further, the inactive surface 39b of the electronic element 39 can be selectively exposed from the encapsulant 41. As such, the surface of the encapsulant 41 is flush with the inactive surface 39b of the electronic element 39 and the upper surfaces of the conductive posts 38.

Figure 3L:
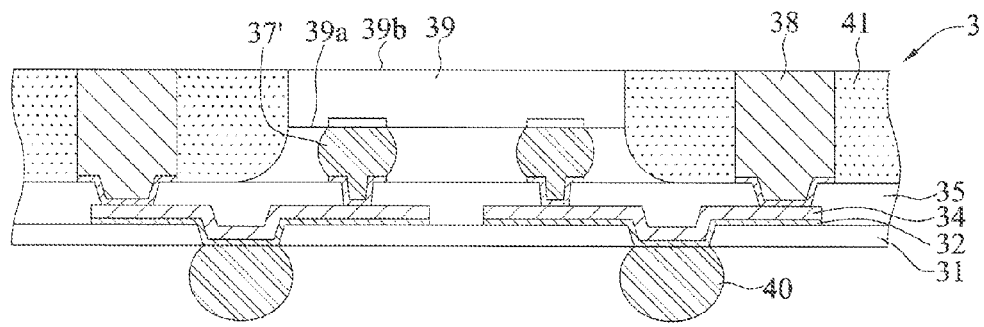

Referring to FIG. 3L, the carrier 30 is removed so as to expose portions of the first metal layer 32 from the first dielectric layer 31.

Then, a plurality of conductive elements 40 are formed on the exposed portions of the first metal layer 32. As such, a package structure 3 is obtained.

In the present embodiment, the conductive elements 40 are solder balls, bumps or conductive pins, and the first metal layer 32 serves as a UBM layer.

Figure 3M:
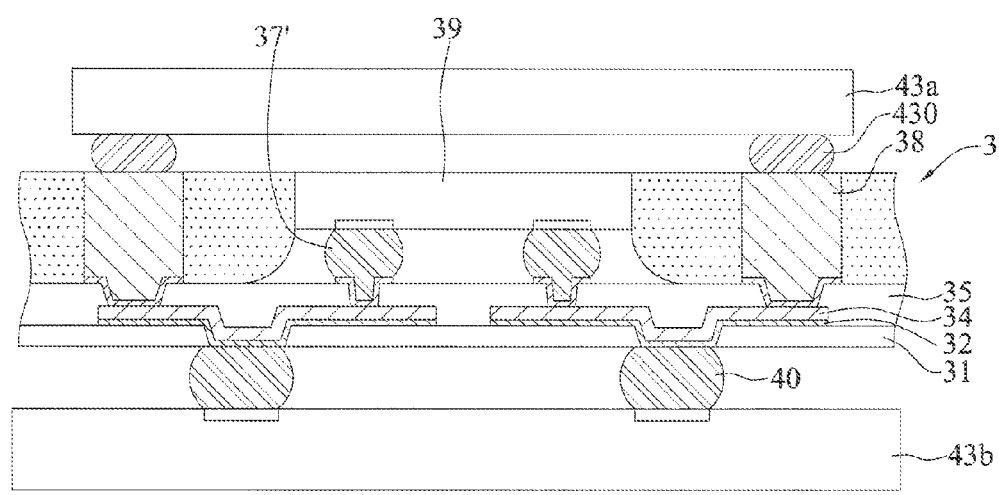

Referring to FIG. 3M, the package structure 3 is disposed on and electrically connected to an electronic element 43b such as a circuit board through the conductive elements 40. Further, another electronic element 43a such as a semiconductor chip or a package is disposed on and electrically connected to the conductive posts 38 through a conductive material 430.

Figure 4A:
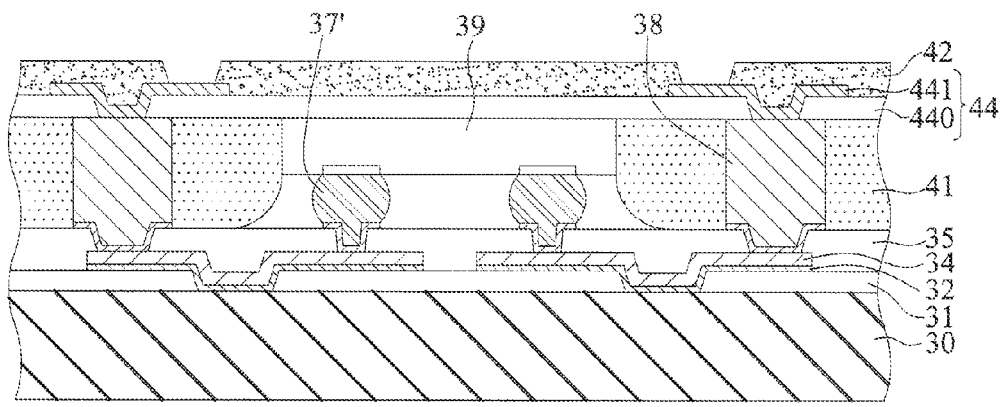
FIGS. 4A to 4C are schematic cross-sectional views showing a method for fabricating a package structure according to a second embodiment of the present invention.
Figure 4B:
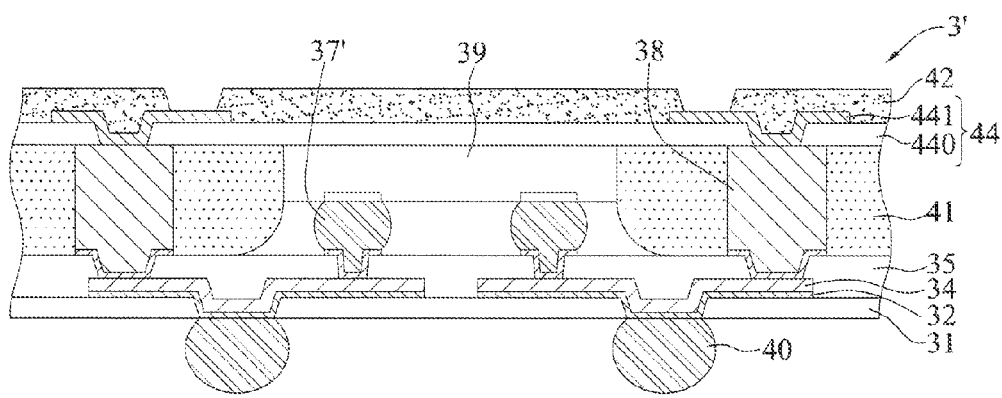
Figure 4C:
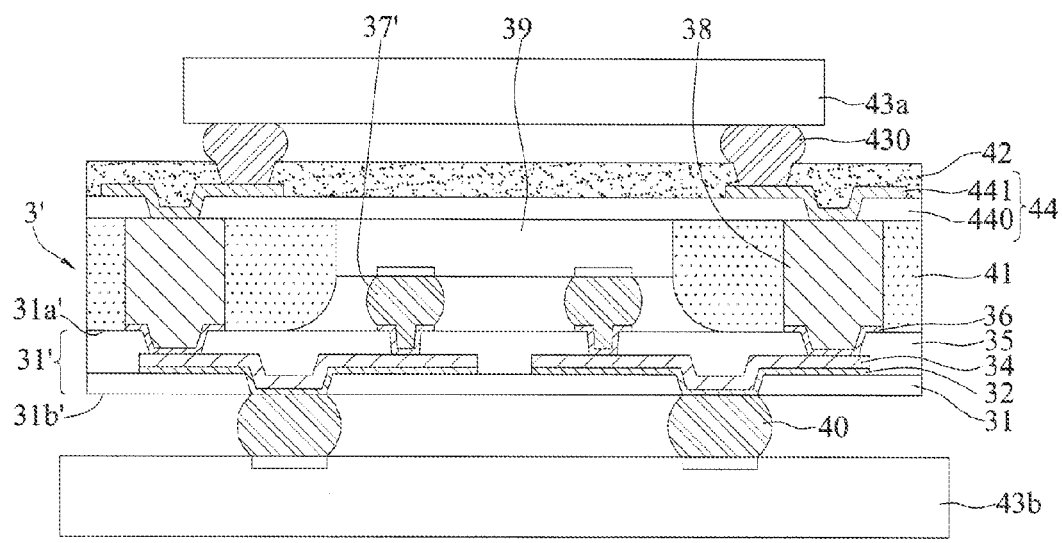

FIGS. 4A to 4C are schematic cross-sectional views showing a method for fabricating a package structure according to a second embodiment of the present invention. The difference of the second embodiment from the first embodiment is detailed as follows.

Referring to FIG. 4A, continued from FIG. 3K, an RDL (Redistribution Layer) structure 44 is further formed on the encapsulant 41 and the conductive posts 38. In the present embodiment, the RDL structure 44 has at least a dielectric layer 440 and a circuit sub-layer 441 formed on the dielectric layer 440 and electrically connected to the conductive posts 38. In another embodiment, the dielectric layer 440 is dispensed with and only the circuit sub-layer 441 is formed on the encapsulant 41 and the conductive posts 38.

Thereafter, an insulating layer 42 is formed on the RDL structure 44 and has a plurality of openings exposing the circuit sub-layer 441. The insulating layer 42 is, for example, a solder mask layer.

Referring to FIG. 4B, the carrier 30 is removed and portions of the first metal layer 32 are exposed from the first dielectric layer 31.

Then, a plurality of conductive elements 40 are formed on the exposed portions of the first metal layer 32. As such, a package structure 3' is obtained.

Referring to FIG. 4C, the package structure 3' is disposed on and electrically connected to an electronic element 43b such as a circuit board through the conductive elements 40. Further, another electronic element 43a such as semiconductor chip or a package is disposed on and electrically connected to the circuit sub-layer 441 of the RDL structure 44 through a conductive material 430.

The present invention further provides a package structure, which has: a dielectric layer 31' constituted by a first dielectric layer 31 and a second dielectric layer 35, wherein the dielectric layer 31' has a first surface 31a' and a second surface 31b' opposite to the first surface 31a'; a circuit sub-layer 34 formed in the dielectric layer 31'; an electronic element 39 disposed on the first surface 31a' of the dielectric layer 31' and electrically connected to the circuit sub-layer 34; a plurality of conductive posts 38 formed on the first surface 31a' of the dielectric layer 31' and electrically connected to the circuit sub-layer 34; and an encapsulant 41 formed on the first surface 31a' of the dielectric layer 31' and encapsulating the electronic element 39 and the conductive posts 38, wherein upper surfaces of the conductive posts 38 are exposed from the encapsulant 41.

The package structure further has an RDL structure 44 formed on the encapsulant 41 and electrically connected to the conductive posts 38.

The package structure further has a plurality of conductive elements 40 formed on the second surface 31b' of the dielectric layer 31' and electrically connected to the circuit sub-layer 34.

The package structure further has an electronic element 43a disposed on the RDL structure 44.

According to the present invention, a plurality of conductive posts are formed on the dielectric layer and electrically connected to the circuit sub-layer, and the conductive posts are exposed from the encapsulant. Further, an RDL structure can be formed on the encapsulant and electrically connected to the conductive posts. As such, another electronic element such as a chip or another package structure can be disposed on an upper side of the package structure. Compared with the conventional package structure that only allows another electronic element such as a circuit board, a packaging substrate or a printed circuit board to be disposed on a lower side thereof, the package structure of the present invention has improved functionality and meets the multi-function requirement of current end products.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A method for fabricating a package structure, comprising the steps of:
   providing a dielectric layer having a circuit sub-layer, wherein the dielectric layer has a first surface and a second surface opposite to the first surface, and the circuit sub-layer has a first metal layer formed on the second surface of the dielectric layer and a second metal layer formed on the first surface of the dielectric layer;
   after providing the dielectric layer, providing an electronic element having an active surface with a plurality of electrode pads and an inactive surface opposite to the active surface and disposing the active surface of the electronic element above the first surface of the dielectric layer in a flip-chip manner and forming a plurality of conductive posts on the first surface of the dielectric layer, wherein the plurality of electrode pads of the active surface of the electronic element are electrically connected to the circuit sub-layer by a plurality of conductive bumps formed on the first surface of the dielectric layer, and the conductive posts are electrically connected to the circuit sub-layer; and
   after forming the plurality of conductive posts, forming an encapsulant on the first surface of the dielectric layer to encapsulate the electronic element and the conductive posts, wherein upper surfaces of the conductive posts are exposed from the encapsulant.

2. The method of claim 1, further comprising forming a Redistribution Layer (RDL) structure on the encapsulant, wherein the RDL structure is electrically connected to the conductive posts.

3. The method of claim 1, further comprising forming a plurality of conductive elements on the second surface of the dielectric layer, wherein the conductive elements are electrically connected to the circuit sub-layer.

4. The method of claim 3, further comprising disposing another electronic element on the conductive elements.

5. The method of claim 2, further comprising forming a plurality of conductive elements on the second surface of the dielectric layer, wherein the conductive elements are electrically connected to the circuit sub-layer.

6. The method of claim 5, further comprising disposing another electronic element on the conductive elements.

7. The method of claim 1, further comprising disposing another electronic element on the conductive posts exposed from the encapsulant.

8. The method of claim 2, further comprising disposing another electronic element on the RDL structure.

9. The method of claim 2, wherein the RDL structure at least has a circuit sub-layer.

10. The method of claim 9, further comprising forming an insulating layer on the RDL structure, wherein the insulating layer has a plurality of openings exposing the circuit sub-layer of the RDL structure.

11. The method of claim 1, wherein the first metal layer and the second metal layer serve as Under Bump Metallurgy (UBM) layers.

12. The method of claim 1, after disposing the electronic element on the first surface of the dielectric layer, further comprising forming an underfill between the electronic element and the dielectric layer.

13. The method of claim 1, wherein forming the dielectric layer having the circuit sub-layer comprises:
- forming a first dielectric layer on a surface of a carrier, wherein the first dielectric layer has a plurality of first openings exposing portions of the surface of the carrier;
- forming the first metal layer on the first dielectric layer and in the first openings of the first dielectric layer;
- forming a first resist layer on the first metal layer, wherein the first resist layer has a plurality of open areas exposing portions of the first metal layer on the first dielectric layer and in the first openings;
- forming the circuit sub-layer on the first metal layer in the open areas of the first resist layer; and
- removing the first resist layer and the first metal layer under the first resist layer.

14. The method of claim 13, wherein the circuit sub-layer has a plurality of conductive bumps formed thereon, forming the conductive bumps comprising:
- forming a second dielectric layer on the first dielectric layer and the circuit sub-layer, wherein the second dielectric layer has a plurality of second openings exposing portions of the circuit sub-layer;
- forming the second metal layer on the second dielectric layer and in the second openings of the second dielectric layer;
- forming a second resist layer on the second metal layer, wherein the second resist layer has a plurality of open areas exposing portions of the second metal layer in the second openings and around peripheries of the second openings;
- forming conductive bumps on the second metal layer in the open areas of the second resist layer, wherein the conductive bumps are electrically connected to the circuit sub-layer; and
- removing the second resist layer.

15. The method of claim 14, wherein the circuit sub-layer has a plurality of conductive posts formed thereon, forming the conductive posts comprising:
- forming a third resist layer on the second metal layer and the conductive bumps, wherein the third resist layer has a plurality of open areas exposing portions of the second metal layer; and
- forming conductive posts on the second metal layer in the open areas of the third resist layer, wherein the conductive posts are electrically connected to the circuit sub-layer.

16. The method of claim 15, wherein the circuit sub-layer has a plurality of conductive elements formed thereon, forming the conductive elements comprising:
- removing the carrier so as to expose portions of the first metal layer from the first dielectric layer; and
- forming conductive elements on the exposed portions of the first metal layer.

17. The method of claim 1, after forming the encapsulant, further comprising thinning the encapsulant to expose the upper surfaces of the conductive posts or expose both the upper surfaces of the conductive posts and the inactive surface of the electronic element.

18. A package structure, comprising:
- a dielectric layer having a first surface and a second surface opposite to the first surface;
- a circuit sub-layer formed in the dielectric layer with a plurality of conductive bumps formed on the first surface of the dielectric layer and electrically connected to the circuit sub-layer, wherein the circuit sub-layer has a first metal layer formed on the second surface of the dielectric layer and a second metal layer formed on the first surface of the dielectric layer;
- an electronic element having an active surface with a plurality of electrode pads and an inactive surface opposite to the active surface, the electrode pads of the active surface of the electronic element disposed on the plurality of conductive bumps formed on the first surface of the dielectric layer and electrically connected to the circuit sub-layer through the plurality of conductive bumps in a flip-chip manner;
- a plurality of conductive posts formed on the first surface of the dielectric layer and electrically connected to the circuit sub-layer; and
- an encapsulant formed on the first surface of the dielectric layer and encapsulating the electronic element and the conductive posts, wherein upper surfaces of the conductive posts are exposed from the encapsulant.

19. The structure of claim 18, further comprising an RDL structure formed on the encapsulant and electrically connected to the conductive posts.

20. The structure of claim 19, further comprising an insulating layer formed on the RDL structure.

21. The structure of claim 19, further comprising another electronic element disposed on the RDL structure.

22. The structure of claim 18, further comprising a plurality of conductive elements formed on the second surface of the dielectric layer and electrically connected to the circuit sub-layer.

23. The structure of claim 22, further comprising another electronic element disposed on the conductive elements.

24. The structure of claim 18, further comprising another electronic element disposed on the conductive posts exposed from the encapsulant.

25. The structure of claim 18, wherein the inactive surface of the electronic element is exposed from the encapsulant.

26. The structure of claim 18, wherein the first metal layer and the second metal layer serve as UBM layers.

27. The structure of claim 18, further comprising an underfill formed between the electronic element and the dielectric layer.

* * * * *